(12) United States Patent
Matsui et al.

(10) Patent No.: US 10,008,390 B2
(45) Date of Patent: Jun. 26, 2018

(54) MANUFACTURING METHOD OF SEMICONDUCTOR DEVICE AND SEMICONDUCTOR MANUFACTURING APPARATUS

(71) Applicant: TOSHIBA MEMORY CORPORATION, Tokyo (JP)

(72) Inventors: Yukiteru Matsui, Aichi (JP); Kyoichi Suguro, Kanagawa (JP); Akifumi Gawase, Mie (JP); Takahiko Kawasaki, Aichi (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 14/643,218

(22) Filed: Mar. 10, 2015

(65) Prior Publication Data

US 2016/0027660 A1 Jan. 28, 2016

(30) Foreign Application Priority Data

Jul. 25, 2014 (JP) ................................ 2014-152285

(51) Int. Cl.

| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *H01L 21/3115* | (2006.01) |
| *H01L 21/321* | (2006.01) |

(Continued)

(52) U.S. Cl.
CPC .... *H01L 21/31155* (2013.01); *H01J 37/3171* (2013.01); *H01L 21/304* (2013.01); *H01L 21/30625* (2013.01); *H01L 21/31053* (2013.01); *H01L 21/3212* (2013.01); *H01L 21/3215* (2013.01); *H01L 21/32115* (2013.01); *B81C 2201/0123* (2013.01); *B81C 2201/0125* (2013.01); *H01J 2237/31711* (2013.01)

(58) Field of Classification Search
None
See application file for complete search history.

(56) References Cited

U.S. PATENT DOCUMENTS 5,861,054 A * 1/1999 Miyashita ............... B24B 37/04
106/3
7,344,805 B2  3/2008 Kumano et al.
(Continued)

FOREIGN PATENT DOCUMENTS

| JP | H07-86291 A | 3/1995 |
| JP | 09-162144 | 6/1997 |

(Continued)

*Primary Examiner* — Stephanie P Duclair
(74) *Attorney, Agent, or Firm* — Finnegan, Henderson, Farabow, Garrett & Dunner, L.L.P.

(57) ABSTRACT

A manufacturing method of a semiconductor device according to an embodiment implants impurities into a central portion of a polishing target film or an outer peripheral portion of the central portion of the polishing target film to cause an impurity concentration in the outer peripheral portion of the polishing target film and an impurity concentration in the central portion thereof to be different from each other, thereby modifying a surface of the polishing target film. The modified surface of the polishing target film is polished by a CMP method.

12 Claims, 10 Drawing Sheets

(51) Int. Cl.
*H01J 37/317* (2006.01)
*H01L 21/304* (2006.01)
*H01L 21/306* (2006.01)
*H01L 21/3105* (2006.01)
*H01L 21/3215* (2006.01)

(56) References Cited

U.S. PATENT DOCUMENTS

| | | | | |
|---|---|---|---|---|
| 2002/0059011 | A1* | 5/2002 | Wieczorek | H01L 22/10 700/121 |
| 2004/0155341 | A1* | 8/2004 | Pipes | H01L 21/76237 257/751 |
| 2008/0038908 | A1* | 2/2008 | Henley | H01J 37/185 438/530 |
| 2009/0227087 | A1* | 9/2009 | Ramappa | H01L 21/30625 438/460 |

FOREIGN PATENT DOCUMENTS

| | | |
|---|---|---|
| JP | 2000-012491 | 1/2000 |
| JP | 2001-044201 | 2/2001 |
| JP | 2004-207385 A | 7/2004 |
| JP | 2007-002268 | 1/2007 |
| JP | 2008-16692 A | 1/2008 |
| JP | 2011-138826 | 7/2011 |

* cited by examiner

MANUFACTURING METHOD OF SEMICONDUCTOR DEVICE AND SEMICONDUCTOR MANUFACTURING APPARATUS

CROSS REFERENCE TO RELATED APPLICATIONS

This application is based upon and claims the benefit of priority from the prior Japanese Patent Application No. 2014-152285, filed on Jul. 25, 2014, the entire contents of which are incorporated herein by reference.

FIELD

The embodiments of the present invention relate to a manufacturing method of semiconductor device and a semiconductor manufacturing apparatus.

BACKGROUND

A CMP (Chemical Mechanical Polishing) method is conventionally used in a processing technique of a semiconductor device as a technique to flatten a semiconductor wafer. In the CMP method, improvement in productivity such as throughput or cost is demanded and processing accuracy such as in-plane uniformity or flatness of the semiconductor wafer is also demanded.

For example, in a solid memory having a three-dimensional structure, a protection film or the like includes large concaves and convexes and steps to be flattened are large. In such a case, the film thickness of the protection film or the like to be polished is increased, which prolongs the polishing time. As a result, the throughput is adversely lowered.

In connection thereto, a method of implanting ions into a polishing target film is known as means for increasing the polishing rate. By polishing the polishing target film after implanting ions into the entire surface of the polishing target film or selectively implanting ions into convex portions of the polishing target film, the polishing rate of portions of the polishing target film into which the ions have been implanted can be increased.

However, these methods have problems such as an insufficient polishing rate and degradation in the in-plane uniformity of the semiconductor wafer after polishing.

DETAILED DESCRIPTION

Embodiments will now be explained with reference to the accompanying drawings. The present invention is not limited to the embodiments.

A manufacturing method of a semiconductor device according to an embodiment implants impurities into a central portion of a polishing target film or an outer peripheral portion of the central portion of the polishing target film to cause an impurity concentration in the outer peripheral portion of the polishing target film and an impurity concentration in the central portion thereof to be different from each other, thereby modifying a surface of the polishing target film. The modified surface of the polishing target film is polished by a CMP method.

Reference Example

Figure 1A:
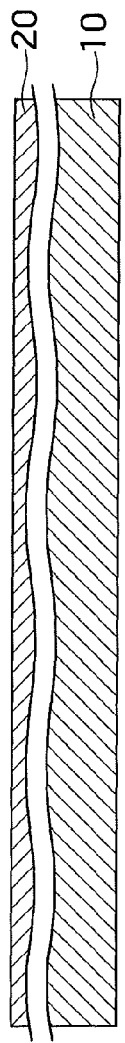
FIGS. 1A to 1C are cross-sectional views showing a manufacturing method of a semiconductor device according to a reference example.
Figure 1B:
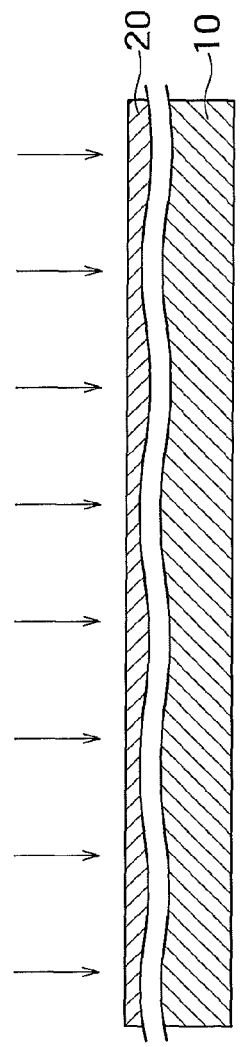
Figure 1C:
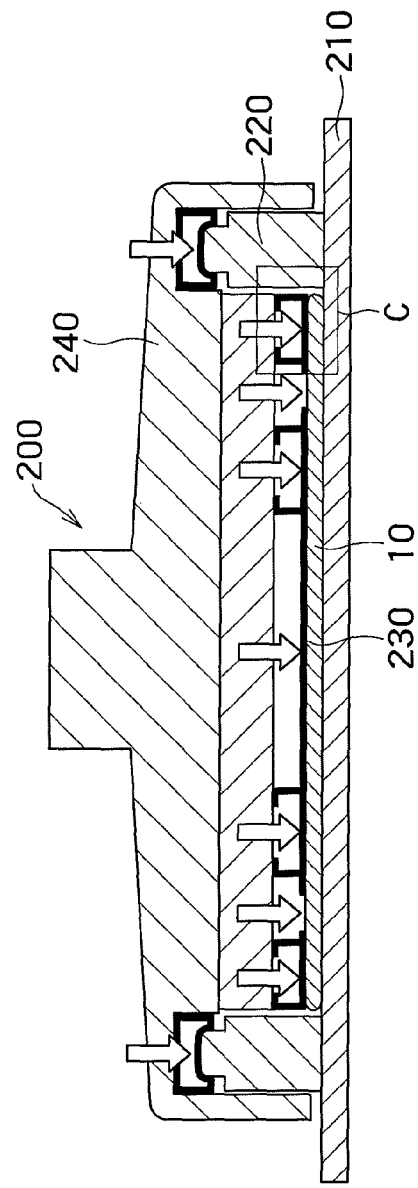

FIGS. 1A to 1C are cross-sectional views showing a manufacturing method of a semiconductor device according to a reference example. Although not particularly limited thereto, the semiconductor device can be, for example, a semiconductor memory, a high-speed logic LSI, a system LSI, or a memory-logic mixed LSI.

First, a semiconductor element (not shown) is formed on a semiconductor substrate 10 and a polishing target film (a target film) 20 is formed above the semiconductor element as shown in FIG. 1A. The polishing target film 20 is a protection film such as an interlayer dielectric film made of a silicon dioxide film. Other examples of the polishing target film 20 can include a film made of silicon, tungsten, copper, or aluminum.

Next, ions of a first-type dopant are implanted into the polishing target film 20 as shown in FIG. 1B. The first-type dopant can be, for example, fluorine (F), boron (B or $BF_2$), phosphorus (P), or nitrogen (N). The ion implantation is performed with the dopant in a dose amount of about $5.00 \times 10^{15}/cm^2$ and at an acceleration voltage of about 50 keV. The dopant is implanted into the entire surface of the polishing target film 20. A concentration of the dopant in the polishing target film 20 is, for example, equal to or higher than $10^{19}$ $cm^{-3}$. The ion implantation of the dopant breaks crystal binding in a surface area of the polishing target film 20 (binding between Si and O in a silicon dioxide film, for example) and modifies the surface of the polishing target film 20.

Subsequently, the polishing target film 20 is polished by the CMP method as shown in FIG. 1C. A CMP device 200 includes a polishing pad 210, a retainer ring 220, a membrane 230, and a head 240. The semiconductor substrate 10 is interposed between the polishing pad 210 and the membrane 230 and is pressed in a direction shown by arrows. When the head 240 turns, the semiconductor substrate 10 is turned on the polishing pad 210. At this time, ceria slurry, silica slurry, alumina slurry, or the like is supplied between the semiconductor substrate 10 and the polishing pad 210.

This enables the polishing target film 20 formed on the underside of the semiconductor substrate 10 in FIG. 1C to be polished. The polishing pad 210 is made of, for example, foamed polyurethane. The retainer ring 220 is made of, for example, ceramics.

Figure 2:
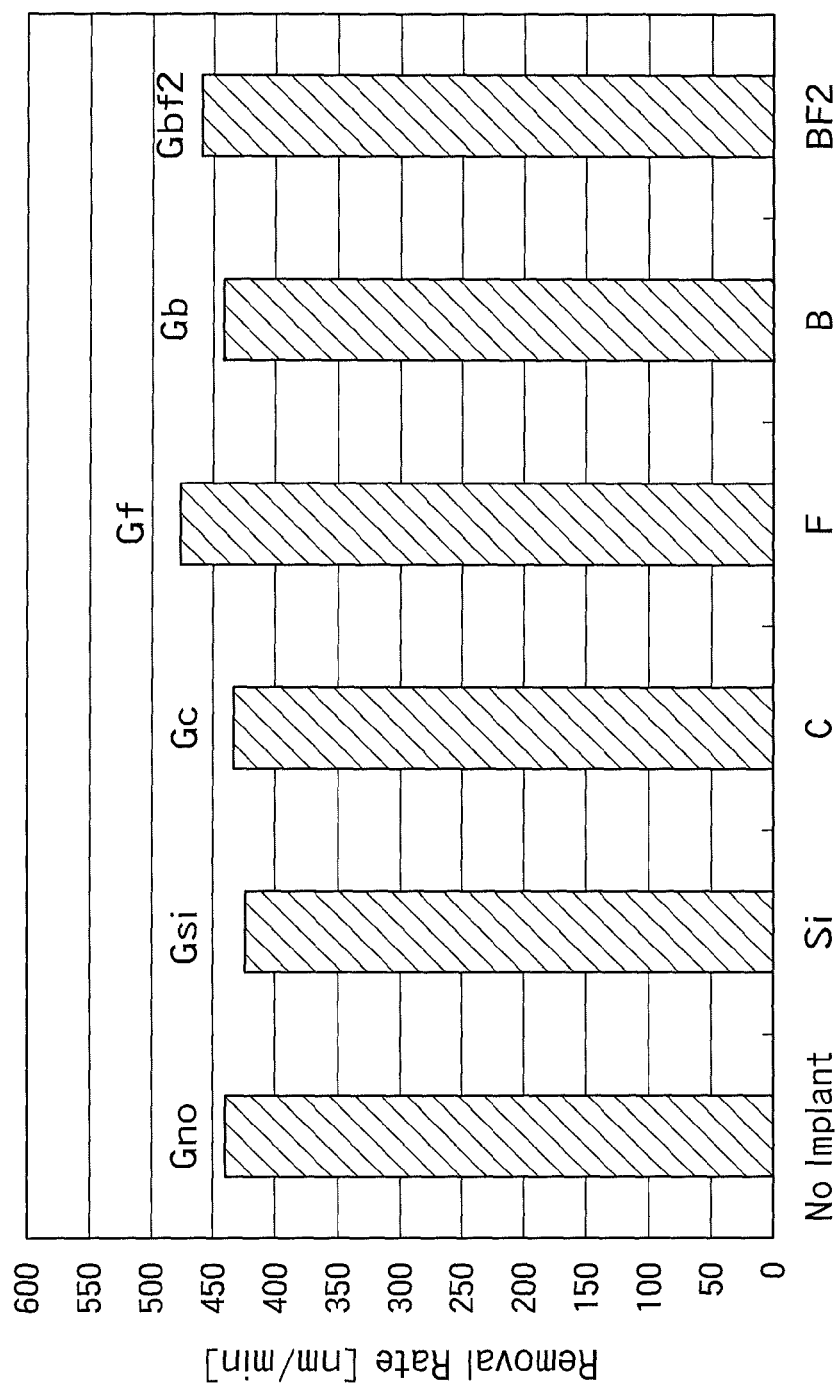
FIG. 2 is a graph showing a relation between dopants and polishing rates.

At this time, because the surface area of the polishing target film 20 is damaged by the ion implantation mentioned above, the polishing rate thereof is higher than that of a polishing target film undamaged. For example, FIG. 2 is a graph showing a relation between dopants and polishing rates. The vertical axis represents the polishing rate. The horizontal axis represents the type of dopant. Gno denotes a graph showing a polishing rate of the polishing target film 20 not subjected to ion implantation. Gf denotes a graph showing a polishing rate of the polishing target film 20 having fluorine ions implanted. From comparison between Gno and Gf, it is understood that the polishing rate of the surface area of the polishing target film 20 having fluorine ions implanted is higher than that of the polishing target film 20 not subjected to ion implantation by about 10%. This is because fluorine ion implantation breaks crystal binding in the surface area of the polishing target film 20 and damages the surface of the polishing target film 20. The polishing rate can be increased also by implanting a first-type dopant such as boron (B or $BF_2$), phosphorus (P), nitrogen (N), or the like, other than fluorine (F), into the polishing target film 20.

As described above, according to the reference example, to increase the polishing rate of the polishing target film 20, ions of the first-type dopant are implanted into the surface area of the polishing target film 20, thereby modifying the surface of the polishing target film 20. The modified surface of the polishing target film 20 is then polished by the CMP method. Accordingly, the polishing time at the CMP step can be shortened and the productivity can be improved. By setting the concentration of the first-type dopant in the polishing target film 20 to $10^{19}$ cm$^{-3}$ or higher, the effect of increasing the polishing rate can be further improved.

First Embodiment

Figure 3:
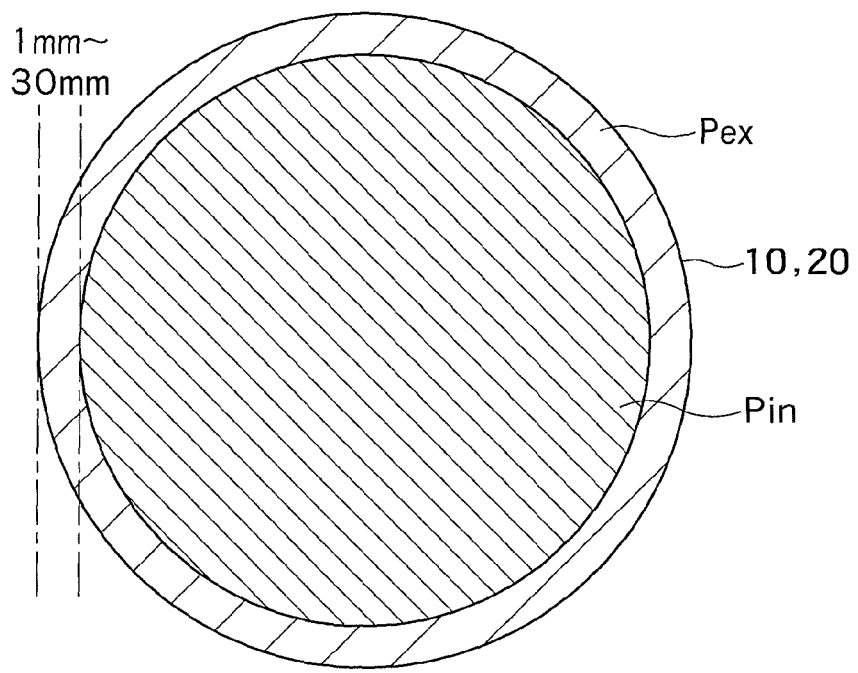
FIG. 3 is a plan view showing a manufacturing method of a semiconductor device according to a first embodiment.

FIG. 3 is a plan view showing a manufacturing method of a semiconductor device according to a first embodiment. In the first embodiment, the first-type dopant mentioned above is implanted selectively into an area (hereinafter, also "central portion Pin"), which is the surface area of the polishing target film 20 except an outer peripheral portion Pex of the semiconductor substrate 10. That is, the outer peripheral portion Pex is a peripheral portion of the central portion Pin of the semiconductor substrate 10.

Figure 4:
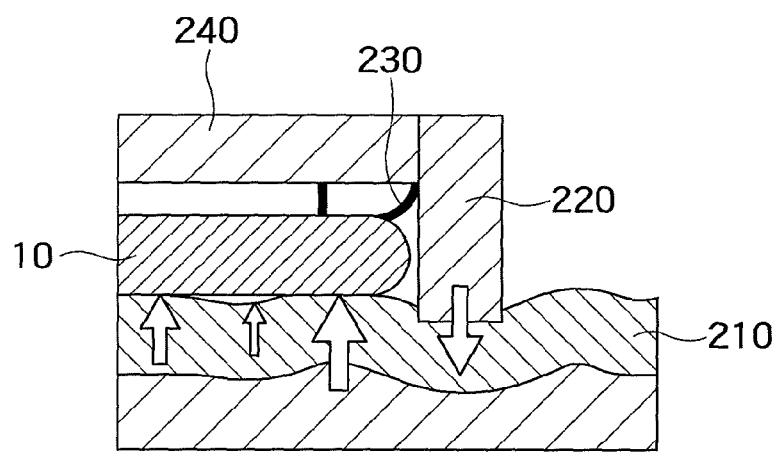
FIG. 4 is a cross-sectional view enlargedly showing a framed portion C in FIG. 1C.

In the CMP method, the polishing pad 210 abutting on the polishing target film 20 at the outer peripheral portion Pex of the semiconductor substrate 10 is undulated due to rebounding against the pressure of the retainer ring 220. For example, FIG. 4 is a cross-sectional view enlargedly showing a framed portion C in FIG. 1C. Directions and sizes of arrows in FIG. 4 indicate directions of pressures between the semiconductor substrate 10 and the polishing pad 210 and sizes of the pressures, respectively. Because the undulated polishing pad 210 is pressed against harder at the outer peripheral portion Pex of the semiconductor substrate 10 than at the central portion Pin, the polishing rate is increased more at the outer peripheral portion Pex of the semiconductor substrate 10 than that at the central portion Pin. This may degrade the flatness in the surface of the polishing target film 20 after polishing.

In the first embodiment, ions of the first-type dopant are thus implanted selectively into the polishing target film 20 at the central portion Pin of the semiconductor substrate 10 except the outer peripheral portion Pex. It suffices that the outer peripheral portion Pex of the semiconductor substrate 10 includes an area in which the polishing pad 210 is undulated due to the pressure of the retainer ring 220. Therefore, for example, when the semiconductor substrate 10 is a semiconductor wafer having a diameter of 300 millimeters, the outer peripheral portion Pex of the semiconductor substrate 10 is, for example, an area on the outer edge side having a width of about 1 millimeter to 30 millimeters. The central portion Pin of the semiconductor substrate 10 is an area on the center side having a diameter of about 299 millimeters to 270 millimeters except the outer peripheral portion Pex.

In this way, by selectively performing ion implantation of the first-type dopant into the polishing target film 20 at the central portion Pin of the semiconductor substrate 10, the polishing rate of the polishing target film 20 at the central portion Pin of the semiconductor substrate 10 can be set closer or substantially equal to the polishing rate of the polishing target film 20 at the outer peripheral portion Pex. That is, ion implantation of the first-type dopant is performed into the central portion Pin of the polishing target film 20 to cause an impurity concentration of the outer peripheral portion Pex of the polishing target film 20 and an impurity concentration of the central portion Pin of the polishing target film 20 to be different from each other. As a result, the flatness in the surface of the polishing target film 20 after polishing is improved.

To implant ions selectively into the central portion Pin of the semiconductor substrate 10, it suffices to form a resist mask to cover the outer peripheral portion Pex of the polishing target film 20 using a lithography technique before the ion implantation step. Alternatively, an ion beam mask that blocks the dopant can be arranged above the outer peripheral portion Pex of the polishing target film 20 at the ion implantation step.

Figure 5:
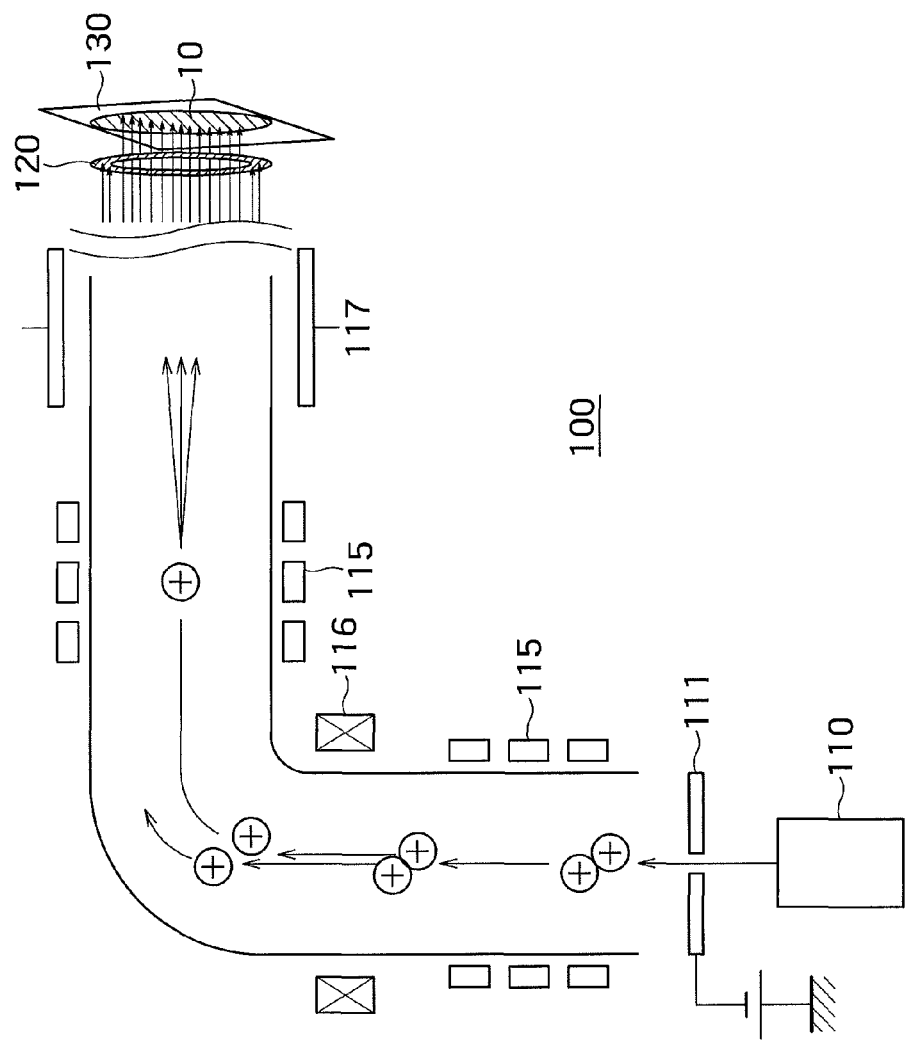
FIG. 5 is a schematic configuration diagram showing an ion implantation device 100 including an ion beam mask 120 according to the first embodiment.

FIG. 5 is a schematic configuration diagram showing an ion implantation device 100 including an ion beam mask 120 according to the first embodiment.

The ion implantation device 100 includes an ion source 110, an extraction electrode 111, an accelerator 115, a mass separator 116, a scanner 117, the ion beam mask 120, a substrate holder (a susceptor) 130, and a mask transporter (not shown). The ion source 110 ionizes a dopant. The extraction electrode 111 extracts the ionized dopant from the ion source 110. The accelerator 115 accelerates the ionized dopant to form an ion beam and irradiates the ion beam toward the substrate holder 130. That is, the ion source 110 and the accelerator 115 function as an ion beam irradiator. The mass separator 116 is provided to select a desired ion type according to a difference in mass and to irradiate the selected ion to the semiconductor substrate 10. The mass separator 116 or the accelerator 115 can include a mass spectrometry magnet or a mass spectrometry slit. The scanner 117 adjusts the direction of irradiation of the ion beam. The substrate holder 130 has the semiconductor substrate 10 mounted thereon.

The ion beam mask 120 is formed annularly to block the ion beam to be irradiated to the outer peripheral portion Pex of the semiconductor substrate 10 (the surface of the polishing target film 20). For example, when the semiconductor substrate 10 is a semiconductor wafer having a diameter of 300 millimeters, the ion beam mask 120 can be an annular mask having an opening with a diameter of about 260 millimeters and having a width of about 20 millimeters. By using the ion beam mask 120 thus formed, the ion beam is irradiated selectively to the surface of the polishing target film 20 at the central portion Pin of the semiconductor substrate 10. Accordingly, ions of the dopant are implanted into the polishing target film 20 at the central portion Pin of the semiconductor substrate 10. The ion beam mask 120 is made of a non-metallic material such as a semiconductor material, graphite, diamond-like carbon (DLC), Si, or SiC. A semiconductor wafer (a silicon wafer, for example) can be alternatively used as the ion beam mask 120. In this way, the ion implantation device 100 used in the first embodiment irradiates an ion beam to the polishing target film 20 to increase the polishing rate of the polishing target film 20. At this time, the ion beam mask 120 partially covers the polishing target film 20 to shield a part of the ion beam. This enables ions of the first-type dopant to be implanted selectively into the polishing target film 20 at the central portion Pin of the semiconductor substrate 10 not through the lithography technique.

When the ion implantation device 100 emits a ribbon-like ion beam or a spot-like ion beam, it suffices that the ion beam mask 120 and the wafer holder 130 move in a direction perpendicular to the direction of irradiation of the ion beam (either in a vertical direction or a horizontal direction) synchronously with each other. Accordingly, even when the ribbon-like ion beam or the spot-like ion beam is used, the ion implantation device 100 can implant ions of the first-type dopant into the polishing target film 20 at the central portion Pin substantially uniformly.

Alternatively, ions of the dopant can be implanted selectively into the central portion Pin of the polishing target film 20 using a scan technique of an ion beam. In this case, an ion implantation device causes an ion beam to scan the semiconductor substrate 10 while changing the concentration of the ion beam. The ion implantation device then turns the semiconductor substrate 10 and causes the ion beam to scan the semiconductor substrate 10 again while changing the concentration of the ion beam. In this way, the ion implantation device can selectively modify the polishing target film 20 at the central portion Pin of the semiconductor substrate 10 without using the ion beam mask 120.

In the first embodiment, a certain amount of the dopant can be implanted into the outer peripheral portion Pex covered by the ion beam mask 120. In this case, it suffices that more ions of the first-type dopant are implanted into the central portion Pin and that the concentration of the dopant in the central portion Pin is higher than that of the outer peripheral portion Pex by $10^{19}$ cm$^{-3}$ or more. This is because the polishing rate of the polishing target film 20 at the central portion Pin of the semiconductor substrate 10 thus can be set closer to the polishing rate of the polishing target film 20 at the outer peripheral portion Pex.

Second Embodiment

Figure 6:
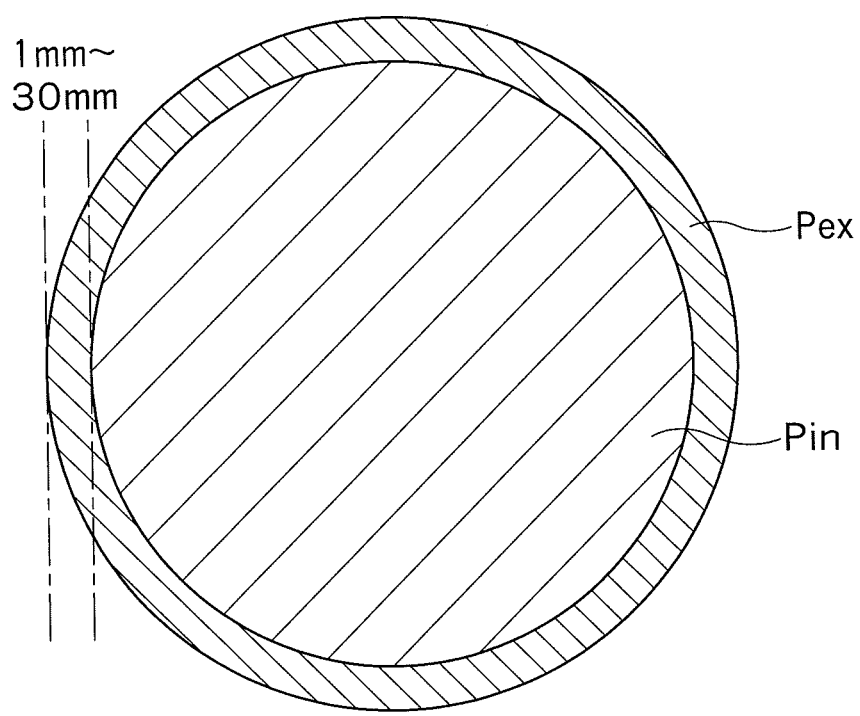
FIG. 6 is a plan view showing a manufacturing method of a semiconductor device according to a second embodiment.

FIG. 6 is a plan view showing a manufacturing method of a semiconductor device according to a second embodiment. In the second embodiment, a second-type dopant is implanted selectively into the outer peripheral portion Pex of the semiconductor substrate 10 in the surface area of the polishing target film 20. The second-type dopant can be, for example, carbon (c), nitrogen (N), or silicon (Si). The ion implantation is performed with the dopant in a dose amount of about 1 to 5.00×10$^{15}$/cm$^2$ and at an acceleration voltage of about 50 keV. The second-type dopant is an element that suppresses a reaction between slurry and the polishing target film 20. Therefore, the ion implantation of the second-type dopant is performed to decrease the polishing rate of the polishing target film 20 at the outer peripheral portion Pex of the semiconductor substrate 10.

Next, the polishing target film 20 is thermally treated to repair crystal defects caused by the ion implantation. The thermal treatment can be RTA (Rapid Thermal Anneal), furnace anneal, microwave anneal, or the like. For example, when an electric furnace, a hot plate, or a lamp (a halogen lamp, for example) is used, the crystal defects caused by the ion implantation can be repaired through thermal treatment at a temperature equal to or higher than 900° C. When microwave irradiation at 5.8 gigahertz is used, the crystal defects caused by the ion implantation can be repaired even at a temperature equal to or lower than 800° C. This thermal treatment enables the crystal binding of the polishing target film 20 broken by the ion implantation to be rebound. That is, the polishing target film 20 damaged by the ion implantation is recovered. Because the quality of the polishing target film 20 is restored, decrease in the polishing rate due to the second-type dopant becomes noticeable. For example, FIG. 2 is referred back to. Gsi indicates a polishing rate of the polishing target film 20 thermally treated after silicon ions are implanted. Gc indicates a polishing rate of the polishing target film 20 thermally treated after carbon ions are implanted. From comparison between Gno and Gsi (or Gc), it is understood that the polishing rate of the surface area of the polishing target film 20 having silicon or carbon implanted thereto becomes lower than that of the polishing target film 20 having no ions implanted. This is because silicon or carbon suppresses a reaction between the polishing target film 20 and slurry at the CMP step and decreases the polishing rate of the polishing target film 20. Nitrogen (N) can be used as the first-type dopant and the second-type dopant. This is for the following reason. That is, when the polishing target film 20 is a silicon dioxide film, binding between Si and O that constitute the silicon dioxide film in the polishing target film 20 having nitrogen ions implanted thereto is broken by implantation of the nitrogen ions. Such a silicon dioxide film is in a state easily reacting with ions in a CMP solution during the period of the CMP step, that is, a state being easily etched. On the other hand, when the thermal treatment mentioned above is performed after nitrogen ions are implanted, binding defects in the polishing target film 20 are repaired. Binding between Si and N with a higher binding energy than that in binding between Si and O is thus formed in the polishing target film 20. Accordingly, the polishing target film 20 during the period of the CMP step is in a state not easily reacting with ions in the CMP solution, that is, a state being not easily etched. For the reason mentioned above, nitrogen (N) can be used as the first-type dopant and the second-type dopant.

In the second embodiment, ions of the second-type dopant are implanted selectively into the polishing target film 20 at the outer peripheral portion Pex of the semiconductor substrate 10. That is, ions of the second-type dopant are implanted into the outer peripheral portion Pex of the polishing target film 20 to cause an impurity concentration in the outer peripheral portion Pex of the polishing target film 20 and an impurity concentration in the central portion Pin of the polishing target film 20 to be different from each other. Accordingly, the polishing rate of the polishing target film 20 at the outer peripheral portion Pex of the semiconductor substrate 10 can be set closer or substantially equal to the polishing rate of the polishing target film 20 at the central portion Pin of the semiconductor substrate 10. As a result, the flatness in the surface of the polishing target film 20 after polishing is improved. Furthermore, when the concentration of the second-type dopant in the polishing target film 20 is set to $10^{19}$ cm$^{-3}$ or higher, the effect of decreasing the polishing rate can be further improved.

To implant ions selectively into the outer peripheral portion Pex of the semiconductor substrate 10, it suffices to form a resist mask to cover the central portion Pin of the polishing target film 20 using the lithography technique before the ion implantation step. Alternatively, an ion beam mask that blocks the dopant can be arranged above the central portion Pin of the polishing target film 20 at the ion implantation step.

Figure 7:
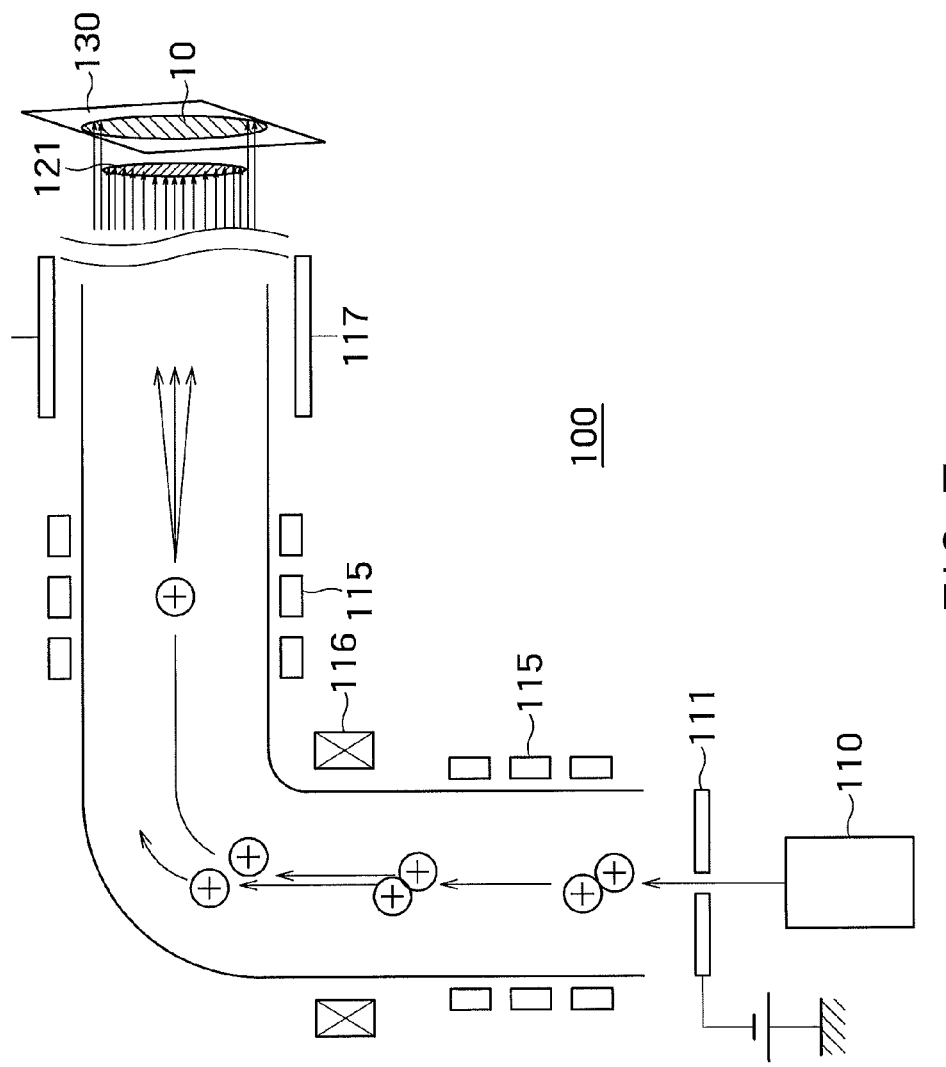
FIG. 7 is a schematic configuration diagram showing the ion implantation device 100 including an ion beam mask 121 according to the second embodiment.

To realize the ion implantation according to the second embodiment, it suffices to change the shape of the ion beam mask 120 of the ion implantation device 100 shown in FIG. 4. For example, FIG. 7 is a schematic configuration diagram showing the ion implantation device 100 including an ion beam mask 121 according to the second embodiment. The ion implantation device 100 in FIG. 7 is different from the ion implantation device 100 in FIG. 5 in the shape of the ion beam mask 121. Other configurations of the ion implantation device 100 in FIG. 7 can be identical to the corresponding configurations of the ion implantation device 100 in FIG. 5. The ion beam mask 121 is formed in a shape to block an ion beam to be irradiated to the central portion Pin of the semiconductor substrate 10 (the surface of the polishing target film 20). For example, when the semiconductor substrate 10 is a semiconductor wafer having a diameter of 300 millimeters, the ion beam mask 121 can be a circular mask having a diameter of about 260 millimeters. By using the ion beam mask 121 as mentioned above, the ion beam can be selectively irradiated to the surface of the polishing target film 20 at the outer peripheral portion Pex of the semiconductor substrate 10. Accordingly, ions of the second-type dopant are implanted into the polishing target film 20 at the outer peripheral portion Pex of the semiconductor substrate 10. The ion beam mask 121 can be formed of the same material as that of the ion beam mask 120. A semiconductor wafer (a silicon wafer, for example) can be used as the ion beam mask 121.

As described above, the ion implantation device 100 used in the second embodiment irradiates an ion beam to the polishing target film 20 to decrease the polishing rate of the polishing target film 20. At this time, the ion beam mask 121 partially covers the polishing target film 20 to shield a part of the ion beam. Accordingly, ions of the second-type dopant can be implanted selectively into the polishing target film 20 at the outer peripheral portion Pex of the semiconductor substrate 10 not through the lithography technique.

When the ion implantation device 100 emits a ribbon-like ion beam, it suffices that the ion beam mask 121 and the wafer holder 130 move in a direction perpendicular to the direction of irradiation of the ion beam (either in a vertical direction or a horizontal direction) synchronously with each other. Accordingly, even when the ribbon-like ion beam is used, the ion implantation device 100 can implant ions of the second-type dopant into the polishing target film 20 at the outer peripheral portion Pex substantially uniformly.

Alternatively, the ion implantation device according to the second embodiment can selectively implant ions of the dopant into the central portion Pin of the polishing target film 20 using a scan technique of an ion beam, similarly to the first embodiment. This enables the ion implantation device to selectively modify the polishing target film 20 at the outer peripheral portion Pex of the semiconductor substrate 10 without using an ion beam mask.

In the second embodiment, a certain amount of dopants can be implanted into the central portion Pin covered by the ion beam mask 121. In this case, it suffices that more ions of the second-type dopant are implanted into the outer peripheral portion Pex and that the concentration of the dopant in the outer peripheral portion Pex is higher than that of the central portion Pin by $10^{19}$ cm$^{-3}$ or more. This is because the polishing rate of the polishing target film 20 at the outer peripheral portion Pex of the semiconductor substrate 10 thus can be set closer to the polishing rate of the polishing target film 20 at the central portion Pin.

Furthermore, the thermal treatment in the second embodiment can be performed at the same time as the ion implantation. For example, the ion implantation can be performed under a situation of a high temperature of 450° C. to 500° C. The ion implantation step and the thermal treatment step can be thus shortened. In a case where heating is performed during the ion implantation, the heating can be performed at a temperature 100° C. to 400° C. lower than that in a case where the heating is performed after the ion implantation in consideration of heating by ions. This can also repair the crystal binding of the polishing target film 20.

Third Embodiment

Figure 8:
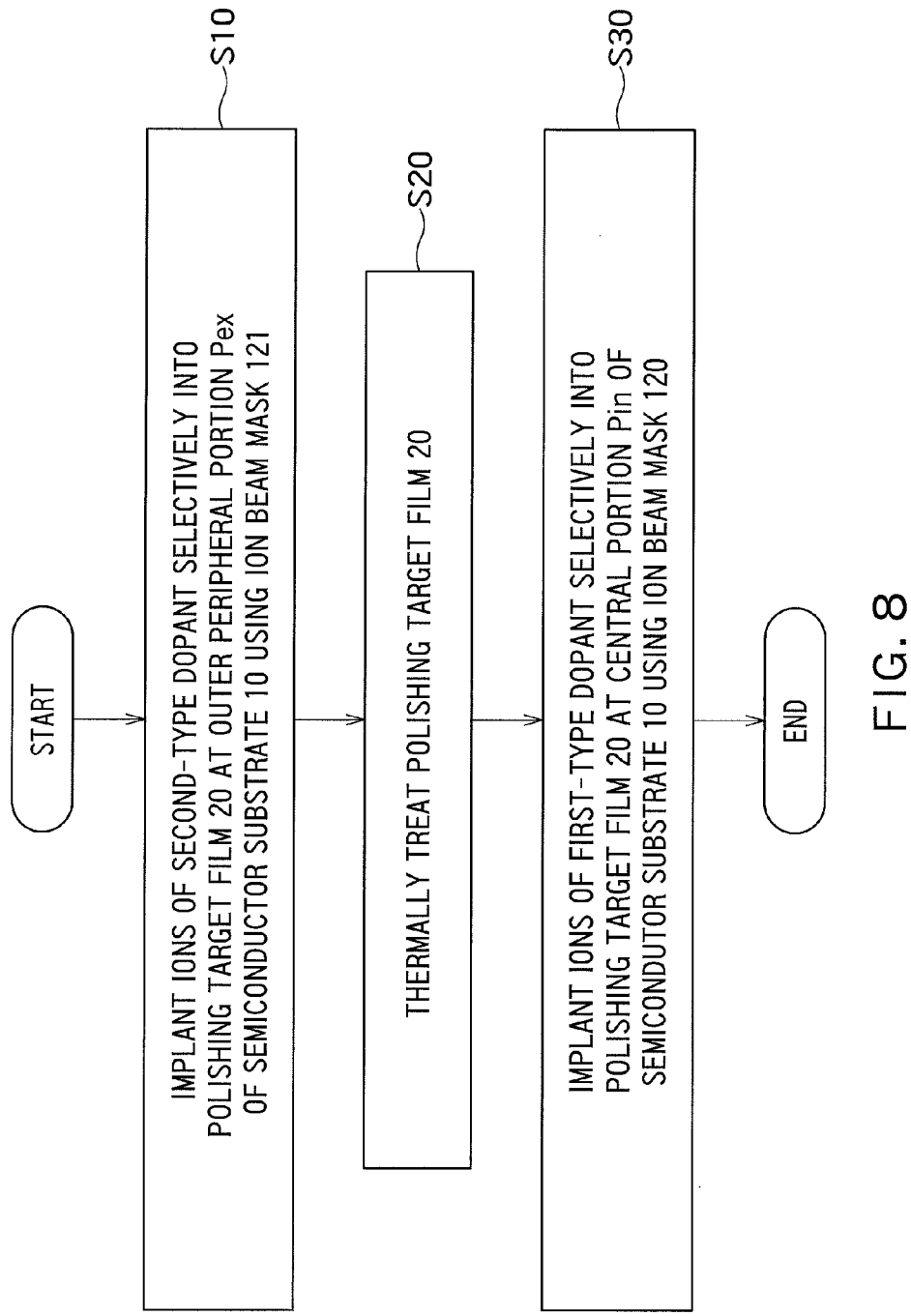
FIG. 8 is a flowchart showing a manufacturing method of a semiconductor device according to a third embodiment.

FIG. 8 is a flowchart showing a manufacturing method of a semiconductor device according to a third embodiment. The third embodiment is a combination of the first and second embodiments. That is, the first-type dopant is implanted selectively into the central portion Pin of the semiconductor substrate 10 in the surface area of the polishing target film 20 and also the second-type dopant is implanted selectively into the outer peripheral portion Pex of the semiconductor substrate 10.

By implanting ions of the first-type dopant selectively into the polishing target film 20 at the central portion Pin of the semiconductor substrate 10, the polishing rate of the polishing target film 20 at the central portion Pin of the semiconductor substrate 10 can be set closer to that of the polishing target film 20 at the outer peripheral portion Pex thereof. By further implanting ions of the second-type dopant selectively into the polishing target film 20 at the outer peripheral portion Pex of the semiconductor substrate 10, the polishing rate of the polishing target film 20 at the outer peripheral portion Pex of the semiconductor substrate 10 can be set more closer to that of the polishing target film 20 at the central portion Pin of the semiconductor substrate 10. As a result, the polishing rate of the polishing target film 20 can be set substantially uniform in the surface of the polishing target film 20 and thus the flatness in the surface of the polishing target film 20 after polishing is improved.

The ion implantation step of the first-type dopant and the ion implantation step of the second-type dopant can be obtained by combining those in the first embodiment and the second embodiment. However, in the first embodiment, the polishing target film 20 is not thermally treated after ion implantation of the first-type dopant. On the other hand, the polishing target film 20 is thermally treated after ion implantation of the second-type dopant in the second embodiment. Therefore, in the third embodiment, the ion implantation step of the second-type dopant, the thermal treatment step, and the ion implantation step of the first-type dopant are performed in this order. In this manner, the first and second embodiments can be combined.

For example, when the ion implantation device 100 is used, the ion implantation device 100 includes both the ion beam masks 121 and 120 and implants ions of both the second-type dopant and the first-type dopant using these masks.

First, to implant ions of the second-type dopant selectively into the outer peripheral portion Pex of the semiconductor substrate 10, the ion implantation device 100 covers the central portion Pin of the polishing target film 20 with the ion beam mask 121 and shields a part of the ion beam. The ion implantation device 100 thus implants ions of the second-type dopant selectively into the polishing target film 20 at the outer peripheral portion Pex of the semiconductor substrate 10 without implanting ions into the central portion Pin of the semiconductor substrate 10 (S10).

Next, the polishing target film 20 is thermally treated (S20). This thermal treatment recovers the polishing target film 20 damaged by the ion implantation.

Subsequently, to implant ions of the first-type dopant selectively into the central portion Pin of the semiconductor substrate 10, the ion implantation device 100 covers the outer peripheral portion Pex of the polishing target film 20 with the ion beam mask 120 and shields a part of the ion beam. The ion implantation device 100 thus implants ions of the first-type dopant selectively into the polishing target film 20 at the central portion Pin of the semiconductor substrate 10 without implanting ions into the outer peripheral portion Pex of the semiconductor substrate 10 (S30).

In this way, the polishing rate of the polishing target film 20 at the outer peripheral portion Pex of the semiconductor substrate 10 can be decreased and also the polishing rate of the polishing target film 20 at the central portion Pin of the semiconductor substrate 10 can be increased. Accordingly, the polishing rate in the entire surface of the polishing target film 20 can be set substantially uniform and the flatness in the surface of the polishing target film 20 after polishing can be improved.

Fourth Embodiment

Figure 9:
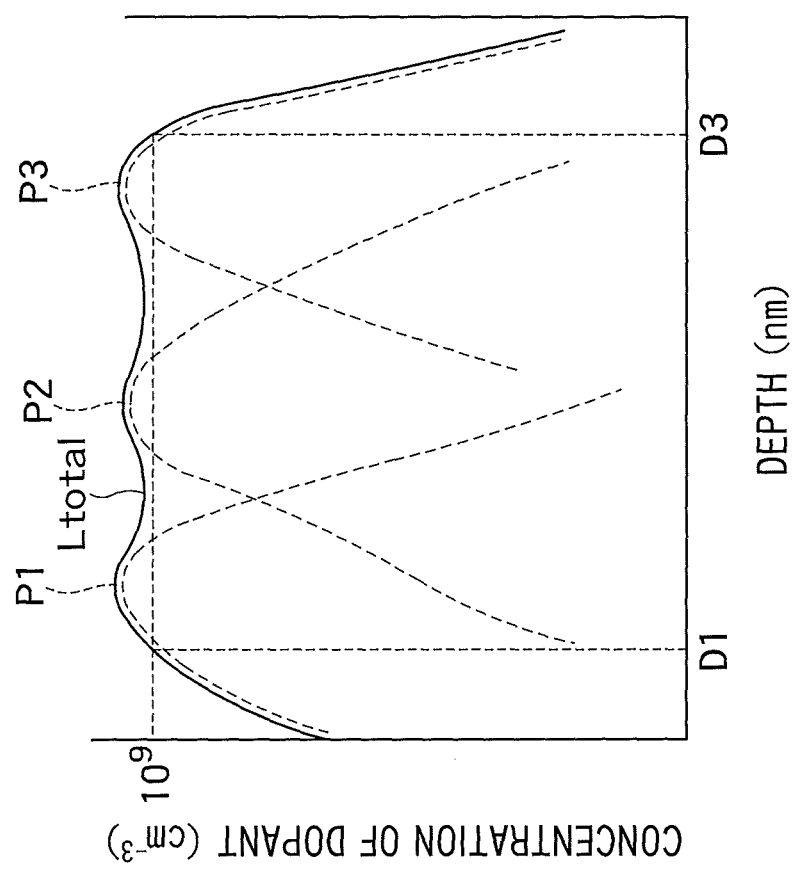
FIG. 9 is a graph showing the concentration of a dopant contained in the polishing target film 20 formed by a manufacturing method of a semiconductor device according to a fourth embodiment.

FIG. 9 is a graph showing the concentration of a dopant contained in the polishing target film 20 formed by a manufacturing method of a semiconductor device according to a fourth embodiment. The vertical axis represents the concentration of the dopant and the horizontal axis represents the depth from the surface of the polishing target film 20.

In the fourth embodiment, to improve the increasing effect on the polishing rate or the decreasing effect on the polishing rate, the ion implantation device 100 implants ions of a dopant into the polishing target film 20 a plurality of times at a plurality of acceleration energies different from each other (multistage ion implantation). The dopant subjected to ion implantation in the fourth embodiment is the first-type dopant and/or the second-type dopant. Accordingly, the fourth embodiment can be applied to any of the first to third embodiments described above.

For example, the ion implantation device 100 implants ions of the first-type dopant at acceleration energies of 10 keV, 30 keV, and 50 keV. The concentration of the dopant thus has three peaks P1 to P3 in the depth direction of the polishing target film 20 as shown in FIG. 9. P1 indicates a concentration peak of the dopant in a case where the acceleration energy is 10 keV. P2 indicates a concentration peak of the dopant in a case where the acceleration energy is 30 keV. P3 indicates a concentration peak of the dopant in a case where the acceleration energy is 50 keV. Between P1 and P2 in the graph, the dopant in the case where the acceleration energy is 10 keV and the dopant in the case where the acceleration energy is 30 keV overlap. Between P2 and P3 of the graph, the dopant in the case where the acceleration energy is 30 keV and the dopant in the case where the acceleration energy is 50 keV overlap. Therefore, by implanting ions of the dopant at the acceleration energies of 10 keV, 30 keV, and 50 keV, the concentration of the first-type dopant becomes high ($10^{19}$ cm$^{-3}$ or higher, for example) entirely in the depths from D1 to D3 as shown by a solid line Ltotal in FIG. 9. That is, the concentration profile of the first-type dopant has a so-called box-type flat profile in a range of the depths from D1 to D3 from the surface of the polishing target film 20. Accordingly, the polishing rate can be increased in the range of the depths from D1 to D3 of the polishing target film 20. That is, according to the fourth embodiment, because the polishing rate is increased in a wide range (D1 to D3) in the width direction of the polishing target film 20, the polishing time at the CMP step can be shortened. Furthermore, when ions of the first-type dopant are implanted, the fourth embodiment can also achieve the effects of the reference example and the first embodiment mentioned above. To increase the polishing rate from the surface of the polishing target film 20, it suffices to adjust the acceleration energies of the ion implantation device 100 to meet D1=0.

Similarly, when ions of the second-type dopant are implanted into the polishing target film 20 a plurality of times at a plurality of acceleration energies different from each other, the concentration profile of the second-type dopant has a so-called box-type flat profile in a range of the depths from D1 to D3 of the polishing target film 20. Accordingly, the polishing rate of the polishing target film 20 can be decreased more effectively. In this case, the fourth embodiment can also achieve the effects of the second embodiment.

It is also possible that the concentration profiles of both the first and second types of dopant in the third embodiment have box-type flat profiles. Accordingly, the effects of the third embodiment can be further improved.

The acceleration energies in the multistage ion implantation are not limited to three stages, but can be also two stages or four or more stages. The acceleration energy can be continuously changed, for example, in a range from 1 keV to 60 keV. Furthermore, the dose amount can be adjusted in a range from $4.00 \times 10^{14}$/cm$^2$ to $1.00 \times 10^{16}$/cm$^2$ to cause the dopant concentration to have a box-type flat profile in the depth direction of the polishing target film 20.

Fifth Embodiment

Figure 10:
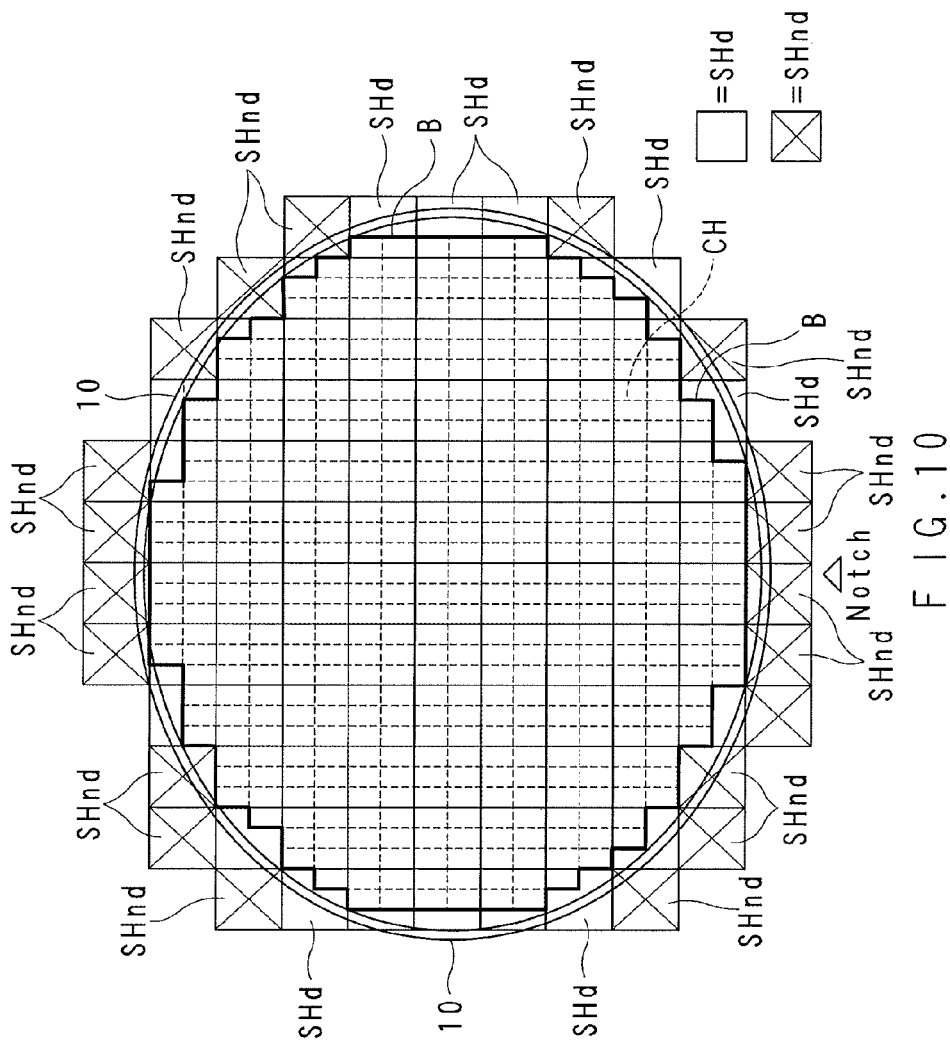
FIG. 10 is a plan view showing a manufacturing method of a semiconductor device according to a fifth embodiment.

FIG. 10 is a plan view showing a manufacturing method of a semiconductor device according to a fifth embodiment. Shots at a lithography step are denoted by solid line frames SHd or SHnd in a plane of the semiconductor substrate 10 shown in FIG. 10. The shot areas SHnd denoted by the frames in which x is shown are areas having patterns (or patterns) not formed. The shot areas SHd denoted by the frames in which x is not shown are areas having patterns (or dummy patterns) formed. Production chips CH are formed in a thick line frame B of the semiconductor substrate 10. The production chips CH are shown by broken line frames. No production chips CH are formed on the semiconductor substrate 10 outside the thick line frame B. Therefore, dummy patterns are formed in parts of the shot areas SHd outside the thick line frame B. Patterns (or dummy patterns) are not formed in an area outside the thick line frame B corresponding to the shot areas SHnd.

Generally, the semiconductor substrate 10 has an outer peripheral portion in which patterns of production chips are not formed as shown in FIG. 10. To shorten throughput at the lithography step, photolithography shots are in some cases not performed on the outer peripheral portion in which no production chips are formed. In these cases, the areas SHd to which shots are performed and in which patterns (or dummy patterns) are formed and the areas SHnd to which no shots are performed and in which patterns (or dummy patterns) are not formed are mixed in the outer peripheral portion of the semiconductor substrate 10. If the semiconductor substrate 10 is polished by the CMP method in such a state, the polishing rates differ between the areas SHd and the areas SHnd. Because patterns (or dummy patterns) are not formed in the shot areas SHnd, a material layer remains as it is. Therefore, in the shot areas SHnd, it is preferable to increase the polishing rate to suppress occurrence of layer remaining. On the other hand, because patterns (or dummy patterns) are formed in the areas SHd, the areas SHd are polished more easily than the areas SHnd. Therefore, if the polishing rate is increased, excessive polishing may occur in the areas SHd.

In the CMP method, the polishing is progressed by turning a semiconductor wafer on a polishing pad. Therefore, the profile of the polishing rate is concentric in a plane of the semiconductor substrate 10. However, the polishing rate varies in the outer peripheral portion of the semiconductor substrate 10 depending on the presence or absence of the patterns (or dummy patterns).

In the fifth embodiment, the first-type dopant is thus implanted selectively into the shot areas SHnd of the surface area of the polishing target film 20 on the semiconductor substrate 10. No dopant is implanted to the shot areas SHd. Accordingly, the polishing rate of the shot areas SHnd is increased to set the polishing rate of the shot areas SHnd closer to the polishing rate of the shot areas SHd.

Figure 11:
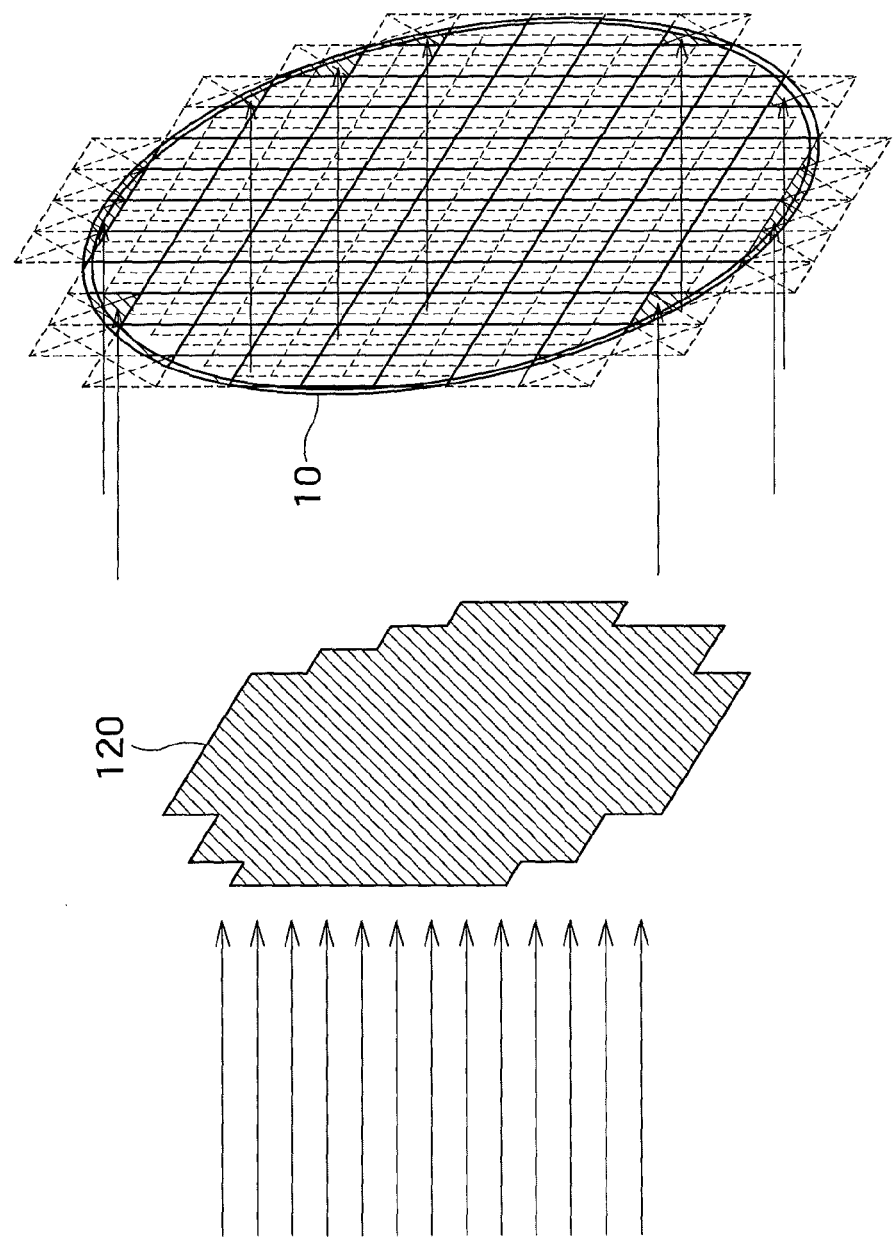
FIG. 11 is a schematic configuration diagram showing the ion implantation device 100 including the ion beam mask 120 according to the fifth embodiment.

FIG. 11 is a schematic configuration diagram showing the ion implantation device 100 including the ion beam mask 120 according to the fifth embodiment. The ion implantation device 100 is basically the same as that of the first embodiment except the shape of the ion beam mask 120. Therefore, the ion source 110, the extraction electrode 111, the accelerator 115, the mass separator 116, the scanner 117, and the like are omitted in FIG. 11.

The ion beam mask 120 is formed to block an ion beam irradiated to the chips CH and the shot areas SHd of the semiconductor substrate 10 and to allow an ion beam irradiated to the shot areas SHnd to pass. Accordingly, ions of the dopant are implanted into the shot areas SHnd not having patterns (or dummy patterns). In FIG. 11, the ions of the dopant are implanted into a hatched portion of the semiconductor substrate 10. The material of the ion beam mask 120 can be identical to that of the first embodiment.

In this way, the polishing rate in the shot areas SHnd can be increased to be closer or equal to the polishing rate in the shot areas SHd. This prevents excessive polishing of the polishing target film 20 in the shot areas SHd among edge portions of the semiconductor substrate 10 and achieves sufficient removal of the polishing target film 20 in the shot areas SHnd. Accordingly, variations in the film thickness (film reduction) at the edge portions of the semiconductor substrate 10 can be suppressed.

Furthermore, the type of dopant to be implanted into the shot areas SHnd and the dose amount thereof can be changed according to an occupancy rate of the production chips CH in the plane of the semiconductor substrate 10. The type of dopant to be implanted into the shot areas SHnd or the dose amount thereof can be changed according to an occupancy rate of convex portions (or concave portions) in the production chips CH. In this way, the polishing rate of the shot areas SHnd can be controlled similarly to the polishing rate of the shot areas SHd in various semiconductor products.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, the method comprising:
    implanting ions of C or Si serving as impurities into an outer peripheral portion of the polishing target film to cause an impurity concentration of ions of C or Si to be larger than an impurity concentration of ions of F, B, P, or N in the outer peripheral portion, so as to modify a surface of the polishing target film;
    thermally treating the polishing target film at a temperature equal to or higher than 900 degrees Celsius after the implantation of the ions of C or Si and before a polishing of the polishing target film;
    polishing the modified surface of the polishing target film by a CMP method, and
    implanting ions of F, B, P, or N serving as impurities into the central portion of the polishing target film to cause an impurity concentration of ions of F, B, P, or N to be larger than an impurity concentration of ions of C or Si in the central portion after the thermally treatment and before the polish.

2. The method of claim 1, wherein the impurities are implanted a plurality of times at a plurality of acceleration energies different from each other.

3. The method of claim 1, wherein the impurities are implanted to cause a concentration profile in a depth direction of the polishing target film to have a plurality of peaks.

4. The method of claim 1, wherein the impurities are implanted at a concentration equal to or higher than $10^{19}$ $cm^{-3}$.

5. The method of claim 1, wherein a polishing agent in the CMP method is slurry containing $CeO_2$ or $SiO_2$.

6. The method of claim 1, wherein the outer peripheral portion of the polishing target film into which the ions are implanted is a first area, in which patterns are not formed, outside of a chip area in which patterns are formed.

7. The method of claim 6, wherein a dopant to be implanted into the first area or a dose amount thereof is changed according to an occupancy rate of the first area or an occupancy rate of convex portions in the patterns.

8. The method of claim 1, wherein
    a width of the outer peripheral portion of the polishing target film is less than 1/10 of a diameter of the polishing target film.

9. A manufacturing method of a semiconductor device, the method comprising:
    implanting ions of N serving as impurities into an outer peripheral portion of the polishing target film to cause an impurity concentration of ions of N to be larger than an impurity concentration of ions of F, B, or P in the outer peripheral portion, so as to modify a surface of the polishing target film;
    thermally treating the polishing target film at a temperature equal to or higher than 900 degrees Celsius after the implantation of the ions of N and before a polishing of the polishing target film;

polishing the modified surface of the polishing target film by a CMP method; and implanting ions of F, B or P serving as impurities into the central portion of the polishing target film to cause an impurity concentration of ions of F, B or P to be larger than an impurity concentration of ions of N in the central portion after the thermally treatment and before the polish.

10. The method of claim 9, wherein a width of the outer peripheral portion of the polishing target film is less than ¹⁄₁₀ of a diameter of the polishing target film.

11. A manufacturing method of a semiconductor device, the method comprising:

implanting ions of N into an outer peripheral portion of a polishing target film using one of the ion beam masks;

thermally treating the polishing target film at a temperature equal to or higher than 900 degrees after implanting the ions N into the outer peripheral portion;

implanting ions of F, B, P, or N into the central portion of the polishing target film using another one of the ion beam masks after the thermal treatment; and polishing the surface of the polishing target film by a CMP method after the implantation of the ions of F, B, P, or N.

12. The method of claim 11, wherein a width of the outer peripheral portion of the polishing target film is less than ¹⁄₁₀ of a diameter of the polishing target film.

* * * * *